United States Patent
Lee et al.

(10) Patent No.: US 10,732,471 B2
(45) Date of Patent: Aug. 4, 2020

(54) ARRAY SUBSTRATE AND DISPLAY DEVICE INCLUDING THE SAME

(71) Applicant: LG Display Co., Ltd., Seoul (KR)

(72) Inventors: Sang-Wook Lee, Paju-si (KR); Duk-Keun Yoo, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 25 days.

(21) Appl. No.: 16/113,336

(22) Filed: Aug. 27, 2018

(65) Prior Publication Data

US 2019/0079363 A1    Mar. 14, 2019

(30) Foreign Application Priority Data

Sep. 13, 2017   (KR) .................. 10-2017-0117270

(51) Int. Cl.
| | | |
|---|---|---|
| *G02F 1/1362* | (2006.01) | |
| *H01L 27/12* | (2006.01) | |
| *G02F 1/1334* | (2006.01) | |
| *G02F 1/1333* | (2006.01) | |

(52) U.S. Cl.
CPC ...... *G02F 1/136286* (2013.01); *G02F 1/1334* (2013.01); *G02F 1/13624* (2013.01); *G02F 1/133305* (2013.01); *G02F 1/136227* (2013.01); *H01L 27/124* (2013.01); *H01L 27/1255* (2013.01); *G02F 1/136213* (2013.01); *G02F 2001/133357* (2013.01); *G02F 2201/40* (2013.01)

(58) Field of Classification Search
CPC ........... G02F 1/136286; G02F 2201/40; G02F 1/13624; H01L 27/124; H01L 23/52
See application file for complete search history.

(56) References Cited

U.S. PATENT DOCUMENTS

| | | | | |
|---|---|---|---|---|
| 2001/0017372 A1* | 8/2001 | Koyama | ........... | G02F 1/136286 257/72 |
| 2003/0214006 A1* | 11/2003 | Nakamura | ........ | G02F 1/136286 257/448 |
| 2007/0090420 A1* | 4/2007 | Chu | .................. | G02F 1/136286 257/291 |

* cited by examiner

*Primary Examiner* — Jia X Pan
(74) *Attorney, Agent, or Firm* — Morgan, Lewis & Bockius LLP

(57) ABSTRACT

An array substrate for a display device includes: a substrate having a plurality of pixel regions; a plurality of gate lines on the substrate, each of the plurality of gate lines including a plurality of gate patterns spaced apart from each other; a plurality of data lines crossing the plurality of gate lines to define the plurality of pixel regions; and a first connecting pattern connecting the plurality of gate patterns, the first connecting pattern having a different layer from the plurality of gate lines.

14 Claims, 7 Drawing Sheets

ARRAY SUBSTRATE AND DISPLAY DEVICE INCLUDING THE SAME

CROSS-REFERENCE TO RELATED APPLICATION

This application claims the benefit of priority of Korean Patent Application No. 10-2017-0117270, filed in the Republic of Korea on Sep. 13, 2017, which is hereby incorporated by reference in its entirety for all purposes as if fully set forth herein.

BACKGROUND

Technical Field

The present disclosure relates to a liquid crystal display device, and more particularly, to a liquid crystal display device displaying a color using a liquid crystal layer including a periodic pattern of a nano size and a liquid crystal capsule.

Discussion of the Related Art

Recently, as the information age progresses, display devices processing and displaying a large amount of information have rapidly advanced. For example, various flat panel displays (FPDs) having a thin profile, a light weight and a low power consumption have been researched.

As a result, a thin film transistor liquid crystal display (TFT-LCD) having an excellent color reproducibility and a thin profile has been developed. The LCD device displays an image using an optical anisotropy and a polarization property of a liquid crystal molecule.

In general, the LCD device includes first and second substrates facing and spaced apart from each other and a liquid crystal layer between the first and second substrates. Since the LCD device includes two glass substrates, the LCD device has a relatively heavy weight and a relatively great thickness and it is not easy to apply the LCD device to a flexible display device.

To improve the above disadvantages of the LCD device, an LCD device including a liquid crystal capsule where a liquid crystal layer including a plurality of liquid crystal capsules is formed on a substrate through a coating method has been suggested. The LCD device including a liquid crystal capsule displays a gray level by changing an effective refractive index anisotropy (or an average refractive index anisotropy) according to an electric field.

In the LCD device including a liquid crystal capsule, to apply a relatively high voltage to a liquid crystal layer, two pixel electrodes are disposed in a single pixel region and the liquid crystal layer is driven by applying two pixel voltages of opposite polarities to the two pixel electrodes.

FIG. 1 is a plan view showing an array substrate for a liquid crystal display device according to the related art.

In FIG. 1, an array substrate 20 for a liquid crystal display (LCD) device according to the related art includes a gate line and a data line crossing each other to define a pixel region P, a common line parallel to the gate line and a thin film transistor (TFT) connected to the gate line and the data line.

For example, the $(n-1)^{th}$, $n^{th}$ and $(n+1)^{th}$ data lines DL(n-1), DLn and DL(n+1) are disposed in side portions of the two horizontally adjacent pixel regions P, the $(l-1)^{th}$ common line CL(l-1), the $(m-1)^{th}$ and $m^{th}$ gate lines GL(m-1) and GLm and the $l^{th}$ common line CL1 are disposed in lower portions of the two horizontally adjacent pixel regions P, and the first and second TFTs T1 and T2 are disposed in upper portions of the $(m-1)^{th}$ and $m^{th}$ gate lines GL(m-1) and GLm.

Each of the first and second TFTs T1 and T2 includes a gate electrode 22, a semiconductor layer (not shown), a source electrode 30 and a drain electrode 32.

The first TFT T1 in a lower portion of the left pixel region P of the two horizontal adjacent pixel regions P is connected to the $(m-1)^{th}$ gate line GL(m-1) and the $(n-1)^{th}$ data line DL(n-1), and the second TFT T2 in a lower portion of the left pixel region P of the two horizontal adjacent pixel regions P is connected to the $(m-1)^{th}$ gate line GL(m-1) and the $n^{th}$ data line DLn.

The first TFT T1 in a lower portion of the right pixel region P of the two horizontal adjacent pixel regions P is connected to the $m^{th}$ gate line GLm and the $n^{th}$ data line DLn, and the second TFT T2 in a lower portion of the right pixel region P of the two horizontal adjacent pixel regions P is connected to the $m^{th}$ gate line GLm and the $(n+1)^{th}$ data line DL(n+1).

A first pixel electrode 38 connected to the first TFT T1 and a second pixel electrode 40 connected to the second TFT T2 are disposed in each of the two horizontally adjacent pixel regions P. The first and second pixel electrodes 38 and 40 are spaced apart from each other and are alternately disposed parallel to each other. In addition, each of the first and second pixel electrodes 38 and 40 and the $(n-1)^{th}$, $n^{th}$ and $(n+1)^{th}$ data lines DL(n-1), DLn and DL(n+1) has a bent bar shape.

When a high voltage VGH of a gate signal is applied to the $(m-1)^{th}$ gate line GL(m-1), the first and second TFTs T1 and T2 are turned on, a first data voltage of a positive polarity (+) of the $(n-1)^{th}$ data line DL(n-1) is applied to the first pixel electrode 38 through the first TFT T1, and a second data voltage of a negative polarity (−) of the $n^{th}$ data line DLn is applied to the second pixel electrode 40 through the second TFT T2.

As a result, a horizontal electric field is generated between the first and second pixel electrodes 38 and 40 in the pixel region P by the first and second data voltages, and a liquid crystal molecule of a liquid crystal layer is realigned according to the horizontal electric field to display a gray level. Since the first and second data voltages have positive and negative polarities, the liquid crystal layer is driven by the first and second data voltages having a relatively great difference.

In the array substrate 20 according to the related art, while the single data line DLn is disposed between the two horizontally adjacent pixel regions P, the two gate lines GL(m-1) and GLm are disposed between the two vertically adjacent pixel regions P.

Since the $(l-1)^{th}$ and $l^{th}$ common lines CL(l-1) and CL1 and the $(m-1)^{th}$ and $m^{th}$ gate lines GL(m-1) and GLm have the same layer as each other, a gap between the $(l-1)^{th}$ common line CL(l-1) and the $m^{th}$ gate line GLm includes a first width w1 between the $(l-1)^{th}$ common line CL(l-1) and the $(m-1)^{th}$ gate line GL(m-1), a second width w2 of the $(m-1)^{th}$ gate line GL(m-1) and a third width w3 between the $(m-1)^{th}$ and the $m^{th}$ gate line GL(m-1) and GLm.

A gap between the two vertically adjacent pixel regions P of a non-display region increases even when a minimum process margin is applied to the first and second widths w1 and w2. As a result, an aperture ratio and a transmittance of the LCD device including a liquid crystal capsule are reduced, and a high resolution cannot be obtained.

SUMMARY

Accordingly, embodiments of the present disclosure are directed to an array substrate and a display device including the same that substantially obviate one or more of the problems due to limitations and disadvantages of the related art.

Aspects of the present disclosure relate to an array substrate and a display device including the array substrate.

One or more aspects of the present disclosure relate to an array substrate and a liquid crystal display device including the array substrate where a gap between two vertically adjacent pixel regions is reduced, an aperture ratio and a transmittance are improved and a high resolution is obtained by connecting gate lines with a connection pattern.

One or more aspects of the present disclosure relate to an array substrate and a liquid crystal display device including the array substrate where a signal delay of a gate line is prevented, a gap between two vertically adjacent pixel regions is reduced, an aperture ratio and a transmittance are improved and a high resolution is obtained by connecting gate lines with at least two connection patterns.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, an array substrate for a display device comprises: a substrate having a plurality of pixel regions; a plurality of gate lines on the substrate, each of the plurality of gate lines including a plurality of gate patterns spaced apart from each other; a plurality of data lines crossing the plurality of gate lines to define the plurality of pixel regions; and a first connecting pattern connecting the plurality of gate patterns, the first connecting pattern having a different layer from the plurality of gate lines.

In another aspect, a display device comprises: a substrate having a plurality of pixel regions; a plurality of gate lines on the substrate, each of the plurality of gate lines including a plurality of gate patterns spaced apart from each other; a plurality of data lines crossing the plurality of gate lines to define the plurality of pixel regions; a first connecting pattern connecting the plurality of gate patterns, the first connecting pattern having a different layer from the plurality of gate lines; and a liquid crystal layer on the plurality of gate line and the plurality of data lines, the liquid crystal layer including a plurality of liquid crystal capsules.

It is to be understood that both the foregoing general description and the following detailed description are explanatory, and are intended to provide further explanation of the aspects as claimed.

BRIEF DESCRIPTION OF THE DRAWINGS

The accompanying drawings, which are included to provide a further understanding of the disclosure, are incorporated in and constitute a part of this application, illustrate embodiments of the disclosure and together with the description serve to explain the principles of the disclosure. In the drawings.

DETAILED DESCRIPTION

Figure 1:
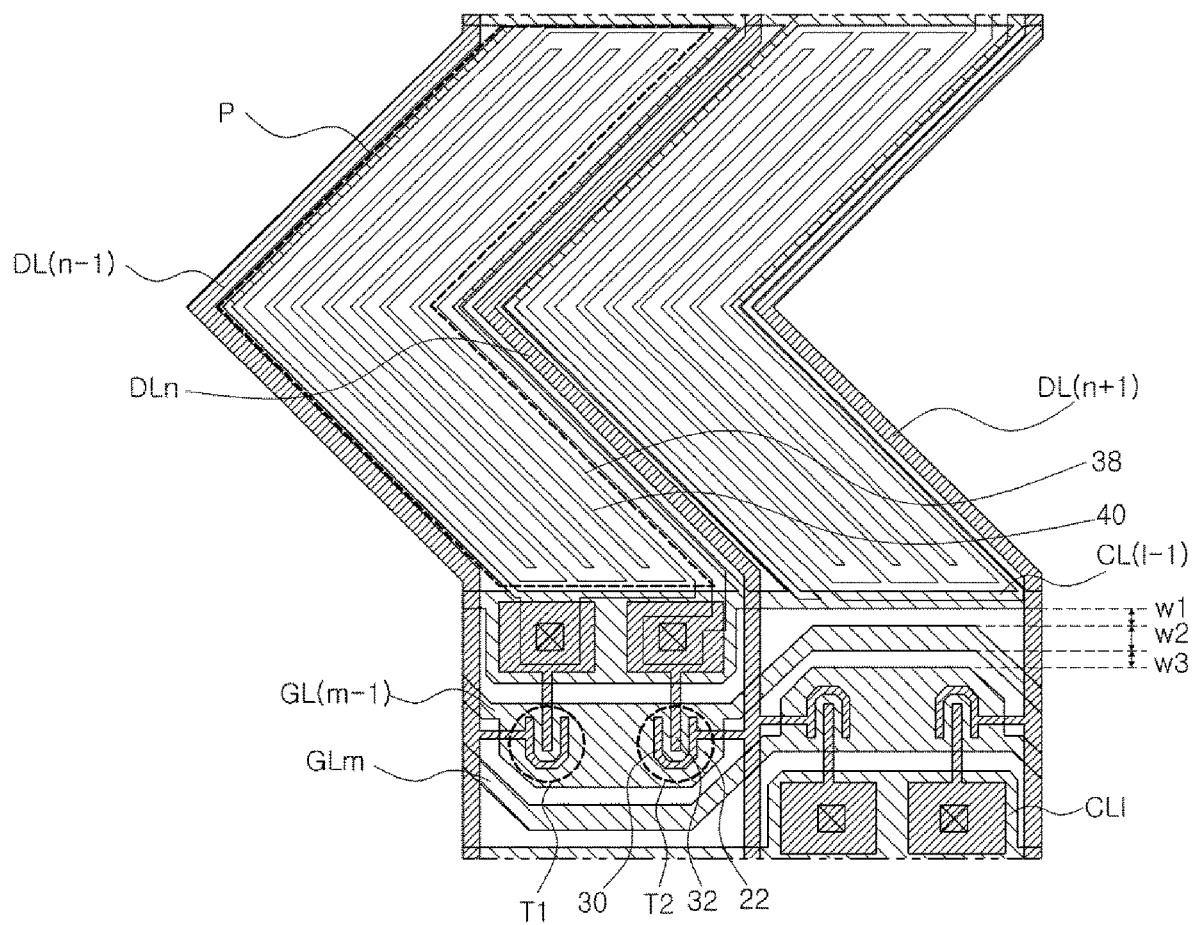
FIG. 1 is a plan view showing an array substrate for a liquid crystal display device according to the related art.

Reference will now be made in detail to aspects of the present disclosure, examples of which are illustrated in the accompanying drawings. In the following description, when a detailed description of well-known functions or configurations related to this document is determined to unnecessarily cloud a gist of an aspect of the disclosure, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a certain order. Like reference numerals designate like elements throughout. Names of the respective elements used in the following explanations are selected only for convenience of writing the specification and may be thus different from those used in actual products.

Figure 2:
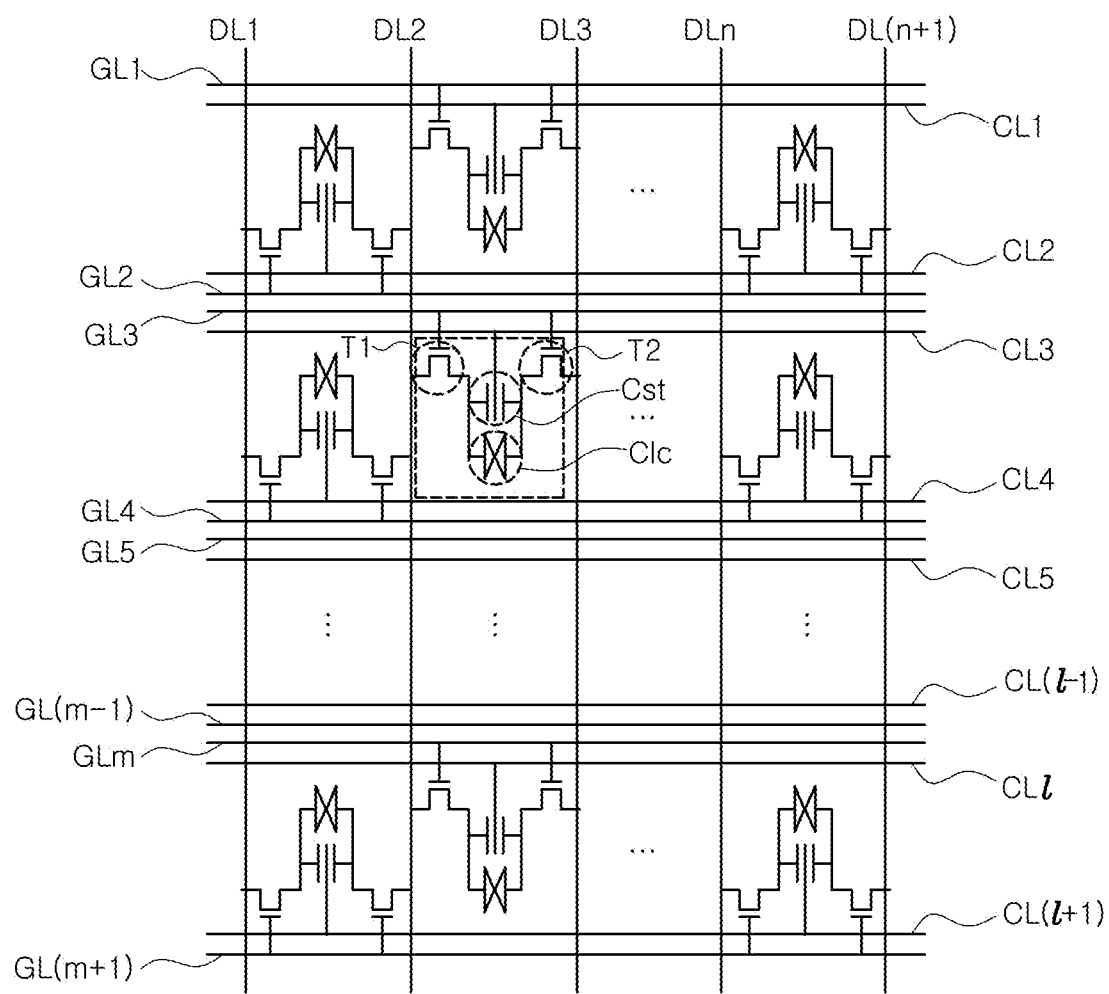
FIG. 2 is an equivalent circuit diagram showing a liquid crystal display device according to a first embodiment of the present disclosure.
Figure 3:
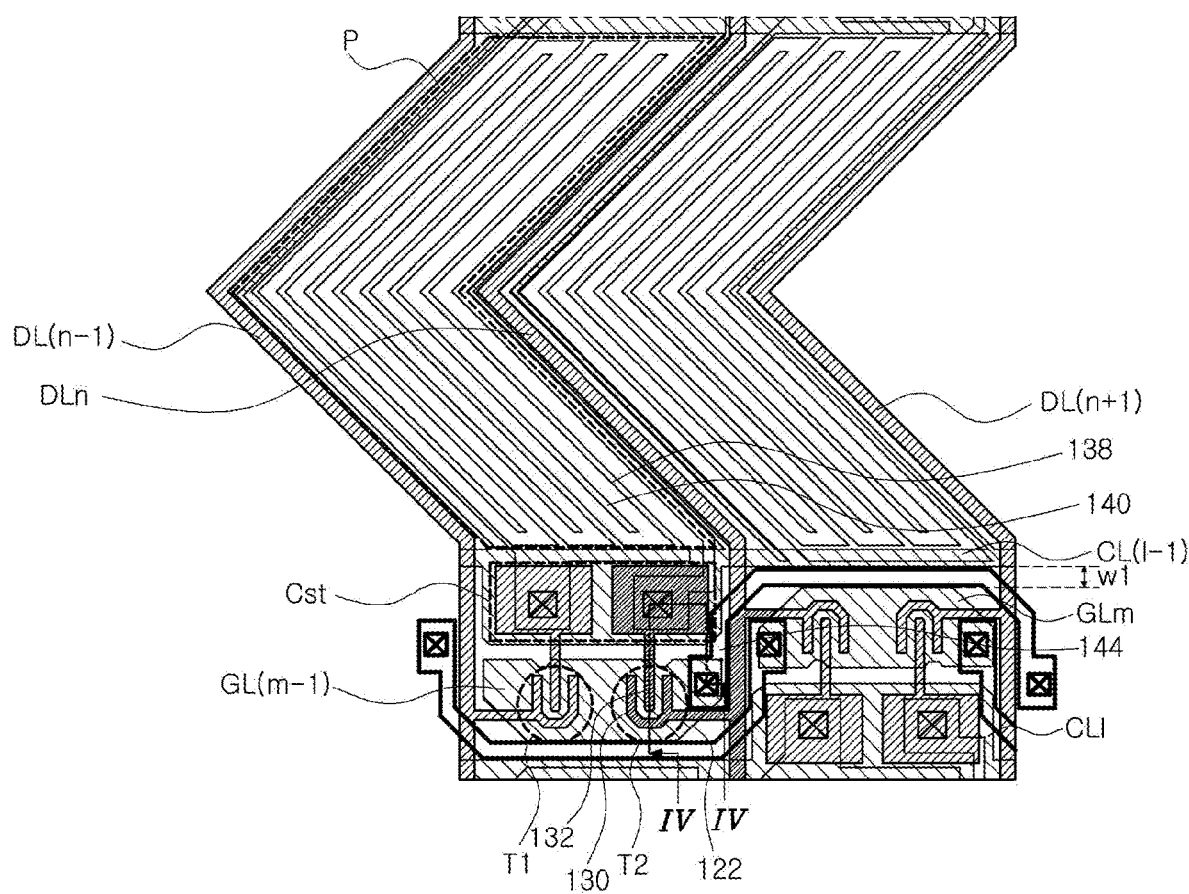
FIG. 3 is a plan view showing an array substrate for a liquid crystal display device according to a first embodiment of the present invention.
Figure 4:
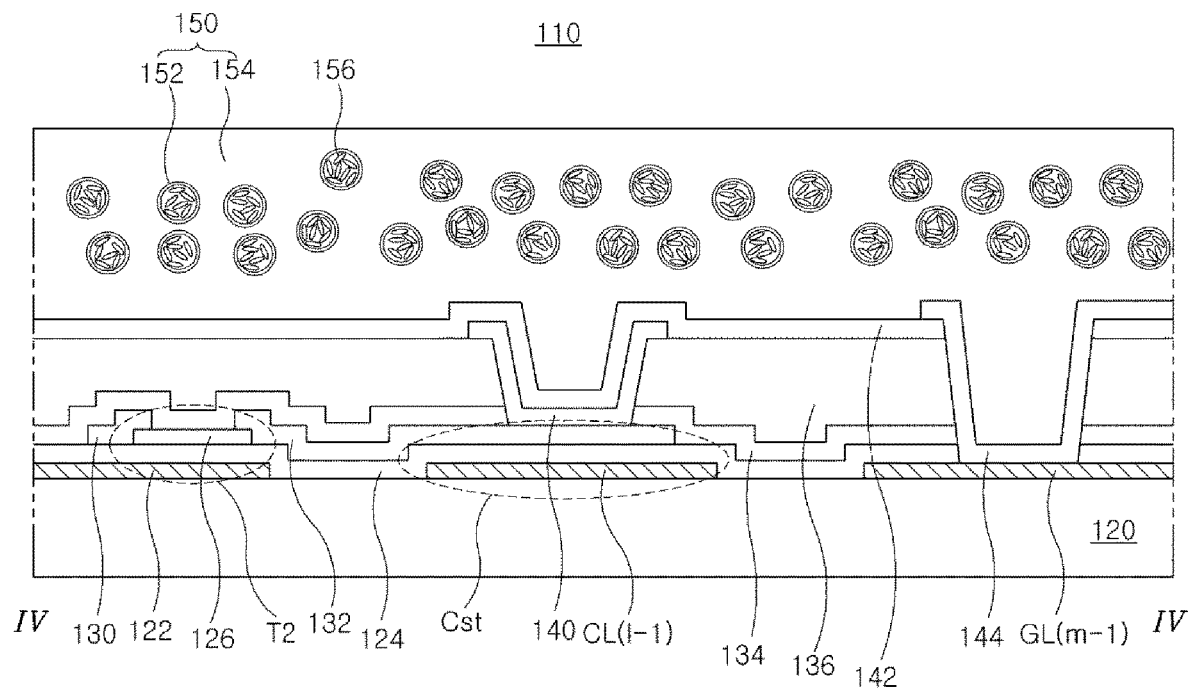
FIG. 4 is a cross-sectional view taken along a line IV-IV of FIG. 3.

FIG. 2 is an equivalent circuit diagram showing a liquid crystal display device according to a first embodiment of the present disclosure, FIG. 3 is a plan view showing an array substrate for a liquid crystal display device according to a first embodiment of the present invention, and FIG. 4 is a cross-sectional view taken along a line IV-IV of FIG. 3.

In FIGS. 2, 3 and 4, a liquid crystal display (LCD) device 110 according a first embodiment of the present disclosure includes a substrate 120 having a plurality of pixel regions P and a liquid crystal layer 150 on the substrate 120.

A plurality of gate lines GL1 to GL(m+1), a plurality of data lines DL1 to DL(n+1), a plurality of common lines CL1 to CL(l+1), and first and second thin film transistors (TFTs) T1 and T2 are disposed on the substrate 120. The plurality of gate lines GL1 to GL(m+1) and the plurality of data lines DL1 to DL(n+1) cross each other to define a plurality of pixel regions P. The plurality of common lines CL1 to CL(l+1) are spaced apart from each other and are disposed parallel to each other. Each of the first and second TFTs T1 and T2 are connected to the plurality of gate lines GL1 to GL(m+1) and the plurality of data lines DL1 to DL(n+1).

The first and second TFTs T1 and T2 are connected to the same gate line and the different data lines.

For example, in one of two horizontally adjacent pixel regions P, gate electrodes 122 of the first and second TFTs T1 and T2 may be connected to the $(m-1)^{th}$ gate line GL(m−1). In addition, a source electrode 130 of the first TFT T1 is connected to the $(n-1)^{th}$ data line DL(n−1), and a source electrode 130 of the second TFT T2 is connected to the $n^{th}$ data line DLn.

In the other of the two horizontally adjacent pixel regions P, gate electrodes 122 of the first and second TFTs T1 and T2 may be connected to the $m^{th}$ gate line GLm. In addition, a source electrode 130 of the first TFT T1 is connected to the $n^{th}$ data line DLn, and a source electrode 130 of the second TFT T2 is connected to the $(n+1)^{th}$ data line DL(n+1).

Drain electrodes of the first and second TFTs T1 and T2 in each pixel region P is connected to a liquid crystal capacitor Clc and a storage capacitor Cst.

The gate electrode 122, the plurality of gate lines GL1 to GL(m+1) and the plurality of common lines CL1 to CL(l+1) are disposed on the substrate 120, and a gate insulating layer 124 is disposed on the gate electrode 122, the plurality of gate lines GL1 to GL(m+1) and the plurality of common lines CL1 to CL(l+1). The gate electrode 122 may be a portion of the plurality of gate lines GL1 to GL(m+1).

A semiconductor layer 126 is disposed on the gate insulating layer 124 corresponding to the gate electrode 122, and the source electrode 130 and the drain electrode 132 are disposed on the semiconductor layer 126. In addition, the plurality of data lines DL1 to DL(n+1) are disposed on the gate insulating layer 124. The plurality of data lines DL1 to DL(n+1) include the same layer and the same material as the source electrode 130 and the drain electrode 132 and cross the plurality of gate lines GL1 to GL(m+1).

The gate electrode 122, the semiconductor layer 126, the source electrode 130 and the drain electrode 132 constitute each of the first and second TFTs T1 and T2, and the drain electrode 132 extends to a portion of the gate insulating layer 124 corresponding to the plurality of common lines CL1 to CL(l+1) to constitute a storage capacitor Cst.

A first passivation layer 134 and a planarizing layer 136 are sequentially disposed on the first and second TFTs T1 and T2. The first passivation layer 134 and the planarizing layer 136 have a drain contact hole exposing the drain electrode 132.

First and second pixel electrodes 138 and 140 are disposed on the planarizing layer 136. The first and second pixel electrodes 138 and 140 are connected to the drain electrodes 132 of the first and second TFTs T1 and T2, respectively, through the drain contact hole. The first and second pixel electrodes 138 and 140 are spaced apart from each other and are alternately disposed parallel to each other. In addition, each of the first and second pixel electrodes 138 and 140 and the plurality of data lines DL1 to DL(n+1) may have a bent bar shape for two-domain structure.

A second passivation layer 142 is disposed on the first and second pixel electrodes 138 and 140. The gate insulating layer 124, the first passivation layer 134, the planarizing layer 136 and the second passivation layer 142 have a gate contact hole exposing the plurality of gate lines GL1 to GL(m+1).

The gate insulating layer 124 and the first and second passivation layers 134 and 142 may include an inorganic insulating material such as silicon oxide ($SiO_2$) and silicon nitride ($SiNx$), and the planarizing layer 136 may include an organic insulating material such as photoacryl.

A connecting pattern 144 is disposed on the second passivation layer 142. The connecting pattern 144 is connected to the plurality of gate lines GL1 to GL(m+1) through the gate contact hole.

Specifically, each of the plurality of gate lines GL1 to GL(m+1) includes a plurality of gate patterns spaced apart from each other, and the single connecting pattern 144 electrically connects the two gate patterns spaced apart from each other.

The liquid crystal layer 150 on the connecting pattern 144 includes a plurality of liquid crystal capsules 152 and a binder where the plurality of liquid crystal capsules 152 are dispersed. Each of the plurality of liquid capsules 152 includes a plurality of liquid crystal molecules 156. For example, the liquid crystal layer 150 may have a thickness within a range of about 1 μm to about 4 μm.

Each of the plurality of liquid crystal capsules 152 may be a polymer capsule having a diameter of about 1 nm to about 999 nm (e.g., a diameter smaller than a wavelength of a visible ray). For example, each liquid crystal capsule 152 may include a water soluble material such as poly vinyl alcohol (PVA) or a fat soluble material such as poly methyl methacrylate (PMMA). Each liquid crystal capsule 152 may have a diameter within a range of about 1 nm to about 320 nm.

The binder 154 may be transparent, half-transparent or opaque, and the binder 154 may have a water solubility, a fat solubility or a mixed property of a water solubility and a fat solubility.

The plurality of liquid crystal molecules 156 may include at least one of a nematic liquid crystal molecule, a ferroelectric liquid crystal molecule and a flexo electric liquid crystal molecule.

The liquid crystal layer 150 may be formed through a soluble process including coating, drying and curing of a liquid crystal capsule solution including the plurality of liquid crystal capsules 152.

Here, since the liquid crystal layer 150 including the plurality of liquid crystal capsules 152 is formed without an additional alignment layer, the liquid crystal layer 150 including the plurality of liquid crystal capsules 152 directly contacts the first and second pixel electrodes 138 and 140.

In the LCD device 110, the single data line DL1 to DLn is disposed between the two horizontally adjacent pixel regions P, and the two gate lines GL1 to GLm and the two common lines CL1 to CL1 are disposed between the two vertically adjacent pixel regions P.

Here, when a high voltage VGH of a gate signal is applied to the $(m-1)^{th}$ gate line GL(m-1), the first and second TFTs T1 and T2 of one of the two horizontally adjacent pixel regions P are turned on, a first data voltage of a positive polarity (+) of the $(n-1)^{th}$ data line DL(n-1) is applied to the first pixel electrode 138 through the first TFT T1, and a second data voltage of a negative polarity (−) of the $n^{th}$ data line DLn is applied to the second pixel electrode 140 through the second TFT T2.

Next, when a high voltage VGH of a gate signal is applied to the $m^{th}$ gate line GLm, the first and second TFTs T1 and T2 of the other of the two horizontally adjacent pixel regions P are turned on, a first data voltage of a positive polarity (+) of the $n^{th}$ data line DLn is applied to the first pixel electrode 138 through the first TFT T1, and a second data voltage of a negative polarity (−) of the $(n+1)^{th}$ data line DL(n+1) is applied to the second pixel electrode 140 through the second TFT T2.

As a result, a horizontal electric field is generated between the first and second pixel electrodes 138 and 140 in the pixel region P by the first and second data voltages, and the liquid crystal molecule 156 in the liquid crystal capsule 152 of the liquid crystal layer 150 is realigned according to the horizontal electric field to display a gray level. Since the first and second data voltages have the positive and negative polarities, the liquid crystal layer 150 is driven by the first and second data voltages having a relatively great difference.

Specifically, each of the plurality of gate lines GL1 to GL(m+1) is formed to include the plurality of gate patterns spaced apart from each other, and the plurality of connecting patterns 144 having a different layer from the plurality of gate patterns connect the plurality of gate patterns. In addition, each connecting pattern 144 is disposed between the common line CL1 to CL(l+1) and the different gate line GL1 to GL(m+1). As a result, an aperture ratio and a transmittance of the LCD device 110 are improved, and an image of a relatively high resolution is obtained.

As shown in FIG. 3, each of the $(m-1)^{th}$ and $m^{th}$ gate lines GL(m-1) and GLm is disposed under the gate insulating layer 124 and includes the plurality of gate patterns having the same layer and the same material (metallic material) as the gate electrode 122. The plurality of gate patterns are electrically connected to each other by the plurality of connecting patterns 144 of a metallic material on the second passivation layer 142.

Here, each connecting pattern 144 connecting the plurality of gate patterns of the $(m-1)^{th}$ gate line GL(m-1) is disposed between the $(l-1)^{th}$ common line CL(l-1) and the $m^{th}$ gate line GLm spaced apart from each other. Since each connecting pattern 144 has a different layer from the $(l-1)^{th}$ common line CL(l-1) and the $m^{th}$ gate line GLm, each connecting pattern 144 may partially overlap or may not overlap the $(l-1)^{th}$ common line CL(l-1) and the $m^{th}$ gate line GLm.

The $(m-1)^{th}$ gate line GL(m-1) is not disposed between the $(l-1)^{th}$ common line CL(l-1) and the $m^{th}$ gate line GLm. Instead, the plurality of connecting patterns 144 having a different layer from the $(l-1)^{th}$ common line CL(l-1) and the $m^{th}$ gate line GLm are disposed between the $(l-1)^{th}$ common line CL(l-1) and the $m^{th}$ gate line GLm. As a result, a minimum gap margin may be applied to a first width w1 between the $(l-1)^{th}$ common line CL(l-1) and the $m^{th}$ gate line GLm.

Since the $(m-1)^{th}$ gate line GL(m-1) is removed between the $(l-1)^{th}$ common line CL(l-1) and the $m^{th}$ gate line GLm and the plurality of connecting patterns 144 of a different layer connecting the plurality of gate patterns of the $(m-1)^{th}$ gate line GL(m-1) are disposed between the $(l-1)^{th}$ common line CL(l-1) and the $m^{th}$ gate line GLm, the first width w1 between the $(l-1)^{th}$ common line CL(l-1) and the $m^{th}$ gate line GLm may be minimized. As a result, an aperture ratio and a transmittance of the LCD device 110 are improved, and an image of a relatively high resolution is obtained.

The plurality of gate patterns are connected to each other by the connecting pattern 144 of a metallic material in the first embodiment, the plurality of gate patterns may be connected to each other by a connecting pattern of a transparent conductive material in another embodiment.

Figure 5:
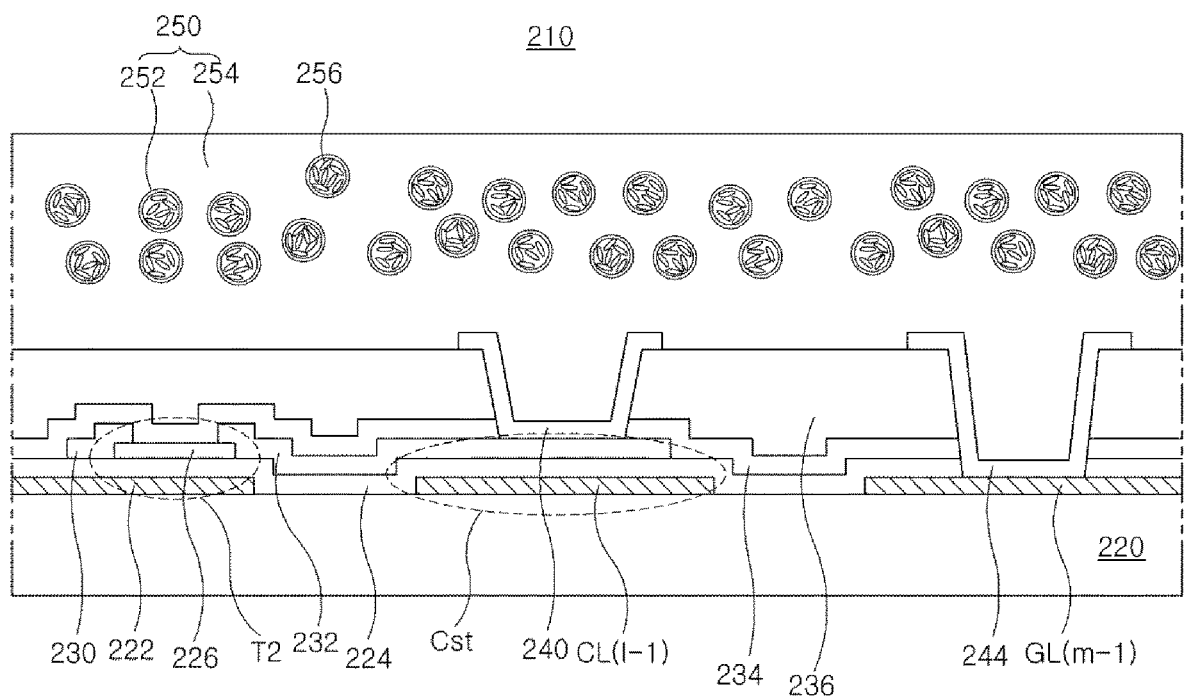
FIG. 5 is a cross-sectional view showing a liquid crystal display device according to a second embodiment of the present disclosure.

FIG. 5 is a cross-sectional view showing a liquid crystal display device according to a second embodiment of the present disclosure. Illustrations on a part of the second embodiment the same as the first embodiment will be omitted.

In FIG. 5, a gate electrode 222, a plurality of gate lines GL1 to GL(m+1) and a plurality of common lines CL1 to CL(l+1) are disposed on a substrate 220, and a gate insulating layer 224 is disposed on the gate electrode 222, the plurality of gate lines GL1 to GL(m+1) and the plurality of common lines CL1 to CL(l+1).

A semiconductor layer 226 is disposed on the gate insulating layer 224 corresponding to the gate electrode 222, and a source electrode 230 and a drain electrode 232 are disposed on both ends of the semiconductor layer 226. In addition, the plurality of data lines DL1 to DL(n+1) are disposed on the gate insulating layer 224. The plurality of data lines DL1 to DL(n+1) include the same layer and the same material as the source electrode 230 and the drain electrode 232 and cross the plurality of gate lines GL1 to GL(m+1).

The gate electrode 222, the semiconductor layer 226, the source electrode 230 and the drain electrode 232 constitute each of first and second TFTs T1 and T2, and the drain electrode 232 extends to a portion of the gate insulating layer 224 corresponding to the plurality of common lines CL1 to CL(l+1) to constitute a storage capacitor Cst.

A first passivation layer 234 and a planarizing layer 236 are sequentially disposed on the first and second TFTs T1 and T2. The first passivation layer 234 and the planarizing layer 236 have a drain contact hole exposing the drain electrode 232, and the gate insulating layer 224, the first passivation layer 234 and the planarizing layer 236 have a gate contact hole exposing the plurality of gate lines GL1 to GL(m+1).

First and second pixel electrodes 238 and 240 and a connecting pattern 244 are disposed on the planarizing layer 236. The connecting pattern 244 has the same layer and the same material as the first and second pixel electrodes 238 and 240. The first and second pixel electrodes 238 and 240 are connected to the drain electrodes 232 of the first and second TFTs T1 and T2, respectively, through the drain contact hole. The connecting pattern 244 is connected to the plurality of gate lines GL1 to GL(m+1) through the gate contact hole.

The first and second pixel electrodes 238 and 240 are spaced apart from each other and are alternately disposed parallel to each other. In addition, each of the first and second pixel electrodes 238 and 240 and the plurality of data lines DL1 to DL(n+1) may have a bent bar shape for two-domain structure.

The gate insulating layer 224 and the first passivation layer 234 may include an inorganic insulating material such as silicon oxide ($SiO_2$) and silicon nitride (SiNx), and the planarizing layer 236 may include an organic insulating material such as photoacryl.

Specifically, each of the plurality of gate lines GL1 to GL(m+1) includes a plurality of gate patterns spaced apart from each other, and the single connecting pattern 244 electrically connects the two gate patterns spaced apart from each other.

In the LCD device 210, the single data line DL1 to DLn is disposed between the two horizontally adjacent pixel regions P, and the two gate lines GL1 to GLm and the two common lines CL1 to CL1 are disposed between the two vertically adjacent pixel regions P.

Specifically, each of the plurality of gate lines GL1 to GL(m+1) is formed to include the plurality of gate patterns spaced apart from each other, and the plurality of connecting patterns 244 having a different layer from the plurality of gate patterns connect the plurality of gate patterns. In addition, each connecting pattern 244 is disposed between the common line CL1 to CL(l+1) and the different gate line GL1 to GL(m+1). As a result, an aperture ratio and a transmittance of the LCD device 210 are improved, and an image of a relatively high resolution is obtained.

Each of the $(m-1)^{th}$ and $m^{th}$ gate lines GL(m-1) and GLm is disposed under the gate insulating layer 224 and includes the plurality of gate patterns having the same layer and the same material (metallic material) as the gate electrode 222. The plurality of gate patterns are electrically connected to each other by the plurality of connecting patterns 244 having the same layer and the same material (transparent conductive material) as the first and second pixel electrodes 238 and 240 on the planarizing layer 236.

Here, each connecting pattern 244 connecting the plurality of gate patterns of the $(m-1)^{th}$ gate line GL(m-1) is disposed between the $(l-1)^{th}$ common line CL(l-1) and the $m^{th}$ gate line GLm spaced apart from each other. Since each connecting pattern 244 has a different layer from the $(l-1)^{th}$ common line CL(l−1) and the m$^{th}$ gate line GLm, each connecting pattern 244 may partially overlap or may not overlap the (l−1)$^{th}$ common line CL(l−1) and the m$^{th}$ gate line GLm.

The (m−1)$^{th}$ gate line GL(m−1) is not disposed between the (l−1)$^{th}$ common line CL(l−1) and the m$^{th}$ gate line GLm. Instead, the plurality of connecting patterns 244 having a different layer from the (l−1)$^{th}$ common line CL(l−1) and the m$^{th}$ gate line GLm are disposed between the (l−1)$^{th}$ common line CL(l−1) and the m$^{th}$ gate line GLm. As a result, a minimum gap margin may be applied to a first width w1 between the (l−1)$^{th}$ common line CL(l−1) and the m$^{th}$ gate line GLm.

Since the (m−1)$^{th}$ gate line GL(m−1) is removed between the (l−1)$^{th}$ common line CL(l−1) and the m$^{th}$ gate line GLm and the plurality of connecting patterns 244 of a different layer connecting the plurality of gate patterns of the (m−1)$^{th}$ gate line GL(m−1) are disposed between the (l−1)$^{th}$ common line CL(l−1) and the m$^{th}$ gate line GLm, the first width w1 between the (l−1)$^{th}$ common line CL(l−1) and the m$^{th}$ gate line GLm may be minimized. As a result, an aperture ratio and a transmittance of the LCD device 210 are improved, and an image of a relatively high resolution is obtained.

The plurality of gate patterns are connected to each other by the connecting pattern 244 of a transparent conductive material in the second embodiment, the plurality of gate patterns may be connected to each other by a first connecting pattern of a metallic material and a second connecting pattern of a transparent conductive material in another embodiment.

Figure 6:
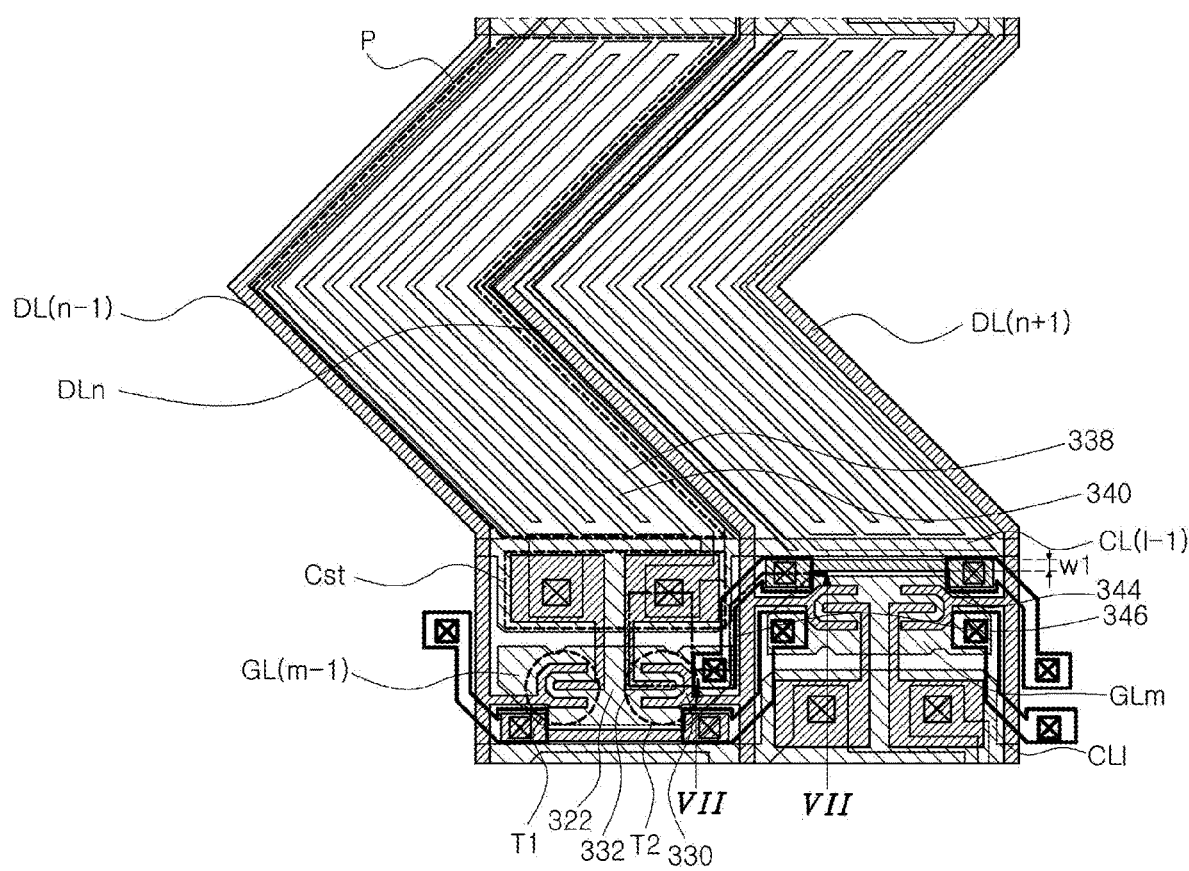
FIG. 6 is a cross-sectional view showing a liquid crystal display device according to a third embodiment of the present disclosure.
Figure 7:
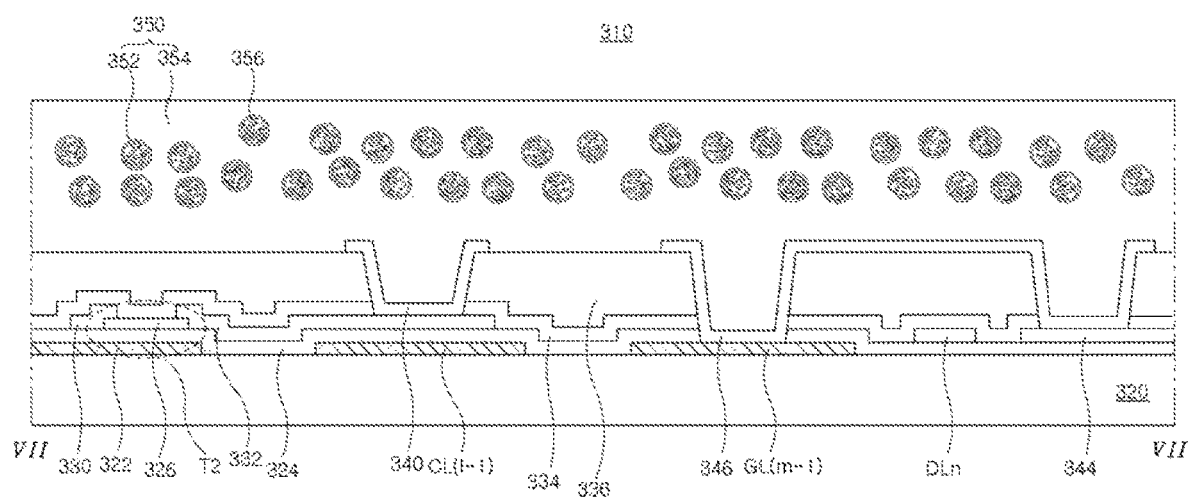
FIG. 7 is a cross-sectional taken along a line VII-VII of FIG. 6.

FIG. 6 is a cross-sectional view showing a liquid crystal display device according to a third embodiment of the present disclosure, and FIG. 7 is a cross-sectional taken along a line VII-VII of FIG. 6. Illustrations on a part of the third embodiment the same as the first and second embodiments will be omitted.

In FIGS. 6 and 7, a gate electrode 322, a plurality of gate lines GL1 to GL(m+1) and a plurality of common lines CL1 to CL(l+1) are disposed on a substrate 320, and a gate insulating layer 324 is disposed on the gate electrode 322, the plurality of gate lines GL1 to GL(m+1) and the plurality of common lines CL1 to CL(l+1).

A semiconductor layer 326 is disposed on the gate insulating layer 324 corresponding to the gate electrode 322, and a source electrode 330 and a drain electrode 332 are disposed on both ends of the semiconductor layer 326. In addition, the plurality of data lines DL1 to DL(n+1) are disposed on the gate insulating layer 324. The plurality of data lines DL1 to DL(n+1) include the same layer and the same material as the source electrode 330 and the drain electrode 332 and cross the plurality of gate lines GL1 to GL(m+1).

Further, a first connecting pattern 344 is disposed on the gate insulating layer 324. The first connecting patterns 344 is disposed between the common line CL1 to CL(l+1) and the different gate line GL1 to GL(m+1) and includes the same layer and the same material as the source electrode 330 and the drain electrode 332.

The gate electrode 322, the semiconductor layer 326, the source electrode 330 and the drain electrode 332 constitute each of first and second TFTs T1 and T2, and the drain electrode 332 extends to a portion of the gate insulating layer 324 corresponding to the plurality of common lines CL1 to CL(l+1) to constitute a storage capacitor Cst.

A first passivation layer 334 and a planarizing layer 336 are sequentially disposed on the first and second TFTs T1 and T2. The first passivation layer 334 and the planarizing layer 336 have a drain contact hole exposing the drain electrode 332 and a connecting pattern contact hole exposing the first connecting pattern 344, and the gate insulating layer 324, the first passivation layer 334 and the planarizing layer 336 have a gate contact hole exposing the plurality of gate lines GL1 to GL(m+1).

First and second pixel electrodes 338 and 340 and a second connecting pattern 346 are disposed on the planarizing layer 336. The second connecting pattern 346 has the same layer and the same material as the first and second pixel electrodes 338 and 340. The first and second pixel electrodes 338 and 340 are connected to the drain electrodes 332 of the first and second TFTs T1 and T2, respectively, through the drain contact hole. The second connecting pattern 346 is connected to the plurality of gate lines GL1 to GL(m+1) through the gate contact hole and is connected to the first connecting pattern 344 through the connecting pattern contact hole.

The first and second pixel electrodes 338 and 340 are spaced apart from each other and are alternately disposed parallel to each other. In addition, each of the first and second pixel electrodes 338 and 340 and the plurality of data lines DL1 to DL(n+1) may have a bent bar shape for two-domain structure.

The gate insulating layer 324 and the first passivation layer 334 may include an inorganic insulating material such as silicon oxide ($SiO_2$) and silicon nitride (SiNx), and the planarizing layer 336 may include an organic insulating material such as photoacryl.

Specifically, each of the plurality of gate lines GL1 to GL(m+1) includes a plurality of gate patterns spaced apart from each other, and the single first connecting pattern 344 and the two second connecting patterns 346 electrically connects the two gate patterns spaced apart from each other.

In the LCD device 310, the single data line DL1 to DLn is disposed between the two horizontally adjacent pixel regions P, and the two gate lines GL1 to GLm and the two common lines CL1 to CL1 are disposed between the two vertically adjacent pixel regions P.

Specifically, each of the plurality of gate lines GL1 to GL(m+1) is formed to include the plurality of gate patterns spaced apart from each other, and the plurality of first connecting patterns 344 and the plurality of second connecting patterns 346 having a different layer from the plurality of gate patterns connect the plurality of gate patterns. In addition, each first connecting pattern 344 is disposed between the common line CL1 to CL(l+1) and the different gate line GL1 to GL(m+1). As a result, an aperture ratio and a transmittance of the LCD device 210 are improved, and an image of a relatively high resolution is obtained.

Each of the (m−1)$^{th}$ and m$^{th}$ gate lines GL(m−1) and GLm is disposed under the gate insulating layer 324 and includes the plurality of gate patterns having the same layer and the same material (metallic material) as the gate electrode 322. The plurality of gate patterns are electrically connected to each other by the plurality of first connecting patterns 344 disposed between the gate insulating layer 324 and the first passivation layer 334 and having the same layer and the same material (metallic material) as the source electrode 330 and the drain electrode 332 and the plurality of second connecting patterns 346 disposed on the planarizing layer 336 and having the same layer and the same material (transparent conductive material) as the first and second pixel electrodes 338 and 340.

Here, each first connecting pattern 344 connected between the plurality of second connecting patterns 346 connecting the plurality of gate patterns of the $(m-1)^{th}$ gate line GL(m−1) is disposed between the $(l-1)^{th}$ common line CL(l−1) and the $m^{th}$ gate line GLm spaced apart from each other. Since each first connecting pattern 344 has a different layer from the $(l-1)^{th}$ common line CL(l−1) and the $m^{th}$ gate line GLm, each first connecting pattern 344 may partially overlap or may not overlap the $(l-1)^{th}$ common line CL(l−1) and the $m^{th}$ gate line GLm.

The $(m-1)^{th}$ gate line GL(m−1) is not disposed between the $(l-1)^{th}$ common line CL(l−1) and the $m^{th}$ gate line GLm. Instead, the plurality of first connecting patterns 344 having a different layer from the $(l-1)^{th}$ common line CL(l−1) and the $m^{th}$ gate line GLm are disposed between the $(l-1)^{th}$ common line CL(l−1) and the $m^{th}$ gate line GLm. As a result, a minimum gap margin may be applied to a first width w1 between the $(l-1)^{th}$ common line CL(l−1) and the $m^{th}$ gate line GLm.

Since the $(m-1)^{th}$ gate line GL(m−1) is removed between the $(l-1)^{th}$ common line CL(l−1) and the $m^{th}$ gate line GLm and the plurality of first connecting patterns 344 of a different layer connecting the plurality of gate patterns of the $(m-1)^{th}$ gate line GL(m−1) are disposed between the $(l-1)^{th}$ common line CL(l−1) and the $m^{th}$ gate line GLm, the first width w1 between the $(l-1)^{th}$ common line CL(l−1) and the $m^{th}$ gate line GLm may be minimized. As a result, an aperture ratio and a transmittance of the LCD device 310 are improved, and an image of a relatively high resolution is obtained.

Further, the plurality of gate patterns of each gate line GL1 to GL(m+1) are connected by the plurality of first connecting patterns 344 of a metallic material and the plurality of second connecting patterns 346 of a transparent conductive material instead of only the plurality of second connecting patterns 346 of a transparent conductive material. As a result, a signal delay of each gate line GL1 to GL(m+1) is prevented.

In the first to third embodiments, a structure where the plurality of gate patterns of the gate line are connected to each other by the plurality of connecting patterns having a different layer from the gate line is applied to an array substrate for an LCD device including a liquid crystal capsule. In another embodiment, the structure where the plurality of gate patterns of the gate line are connected to each other by the plurality of connecting patterns having a different layer from the gate line may be applied to an array substrate for a dual rate driving (DRD) type display device where two gate lines are disposed between two vertically adjacent pixel regions and a single data line corresponds to two horizontally adjacent pixel regions or an array substrate for a triple rate driving (TRD) type display device where three gate lines are disposed between two vertically adjacent pixel regions and a single data line corresponds to three horizontally adjacent pixel regions.

Consequently, in an array substrate for a display device according to the present disclosure, since the gate patterns of the gate line are connected to each other by the connecting pattern having a different layer from the gate line, the gap between the vertically adjacent pixel regions is reduced. As a result, the aperture ratio and the transmittance of the display device are improved, and the relatively high resolution is obtained.

Further, the gate patterns of the gate line are connected to each other by the at least two connecting patterns having a different layer from the gate line, the signal delay of the gate line is prevented and the gap between the vertically adjacent pixel regions is reduced. As a result, the aperture ratio and the transmittance of the display device are improved, and the relatively high resolution is obtained.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:
1. An array substrate for a display device, comprising:
a substrate having a plurality of pixel regions;
a plurality of gate lines on the substrate, each of the plurality of gate lines including a plurality of gate patterns spaced apart from each other;
a plurality of data lines crossing the plurality of gate lines to define the plurality of pixel regions; and
a first connecting pattern connecting the plurality of gate patterns, the first connecting pattern having a different layer from the plurality of gate patterns,
wherein the plurality of pixel regions includes first and second pixel regions vertically adjacent to each other,
wherein the plurality of gate lines includes first and second gate lines between the first and second pixel regions, and the first and second gate lines are disposed parallel to each other and are spaced apart from each other, and
wherein the first connecting pattern is disposed between the first pixel region and the second gate line to connect the plurality of gate patterns of the first gate line and is disposed between the second pixel region and the first gate line to connect the plurality of gate patterns of the second gate line.

2. The array substrate of claim 1, further comprising:
first and second thin film transistors corresponding to each of the plurality of pixel regions and connected to the plurality of gate lines and the plurality of data lines;
a planarizing layer on the first and second thin film transistors; and
first and second pixel electrodes alternately disposed on the planarizing layer and connected to the first and second thin film transistors, respectively.

3. The array substrate of claim 2, further comprising a first passivation layer under the planarizing layer and a second passivation layers on the planarizing layer,
wherein the first connecting pattern is disposed on the second passivation layer.

4. The array substrate of claim 3, wherein the first passivation layer and the planarizing layer have drain contact holes exposing drain electrodes of the first and second thin film transistors, and the first passivation layer, the planarizing layer and the second passivation layer have a gate contact hole exposing the plurality of gate patterns,
wherein the first and second pixel electrodes are connected to the drain electrodes of the first and second thin film transistors, respectively, through the drain contact holes, and
wherein the first connecting pattern is connected to the plurality of gate patterns through the gate contact hole.

5. The array substrate of claim 2, further comprising a first passivation layer under the planarizing layer,
wherein the first connecting pattern is disposed on the planarizing layer and has a same layer and a same material as the first and second pixel electrodes.

6. The array substrate of claim 5, wherein the first passivation layer and the planarizing layer have drain contact holes exposing drain electrodes of the first and second thin film transistors and a gate contact hole exposing the plurality of gate patterns, wherein the first and second pixel electrodes are connected to the drain electrodes of the first and second thin film transistors, respectively, through the drain contact holes, and wherein the first connecting pattern is connected to the plurality of gate patterns through the gate contact hole.

7. The array substrate of claim 2, further comprising a first passivation layer under the planarizing layer, wherein the first connecting pattern is disposed under the first passivation layer and has a same layer and a same material as a source electrode and a drain electrode of the first and second thin film transistors.

8. The array substrate of claim 7, further comprising a second connecting pattern connecting the plurality of gate patterns and the first connecting pattern, wherein the second connecting pattern is disposed on the planarizing layer and has a same layer and a same material as the first and second pixel electrodes.

9. The array substrate of claim 8, wherein the first passivation layer and the planarizing layer have drain contact holes exposing drain electrodes of the first and second thin film transistors, a connecting pattern contact hole exposing the first connecting pattern and a gate contact hole exposing the plurality of gate patterns, wherein the first and second pixel electrodes are connected to the drain electrodes of the first and second thin film transistors, respectively, through the drain contact holes, and wherein the second connecting pattern is connected to the plurality of gate patterns, through the gate contact hole and is connected to the first connecting pattern through the connecting pattern contact hole.

10. The array substrate of claim 3, wherein each of the first and second thin film transistors includes a gate electrode, a gate insulating layer on the gate electrode, a semiconductor layer on the gate insulating layer over the gate electrode, a source electrode and a drain electrode on the semiconductor layer, the first passivation layer and the planarizing layer have drain contact holes exposing the drain electrodes of the first and second thin film transistors, and the gate insulating layer, the first passivation layer, the planarizing layer and the second passivation layer have a gate contact hole exposing each of the plurality of gate patterns, wherein the first and second pixel electrodes are connected to the drain electrodes of the first and second thin film transistors, respectively, through the drain contact holes in the first passivation layer and the planarizing layer, and wherein the first connecting pattern is connected to the plurality of gate patterns through the gate contact hole in the gate insulating layer, the first passivation layer, the planarizing layer and the second passivation layer.

11. The array substrate of claim 5, wherein each of the first and second thin film transistors includes a gate electrode, a gate insulating layer on the gate electrode, a semiconductor layer on the gate insulating layer over the gate electrode, a source electrode and a drain electrode on the semiconductor layer, the first passivation layer and the planarizing layer have drain contact holes exposing the drain electrodes of the first and second thin film transistors, and the gate insulating layer, the first passivation layer and the planarizing layer have a gate contact hole exposing each of the plurality of gate patterns, wherein the first and second pixel electrodes are connected to the drain electrodes of the first and second thin film transistors, respectively, through the drain contact holes in the first passivation layer and the planarizing layer, and wherein the first connecting pattern is connected to the plurality of gate patterns through the gate contact hole in the gate insulating layer, the first passivation layer and the planarizing layer.

12. The array substrate of claim 8, wherein each of the first and second thin film transistors includes a gate electrode, a gate insulating layer on the gate electrode, a semiconductor layer on the gate insulating layer over the gate electrode, a source electrode and a drain electrode on the semiconductor layer, wherein the first passivation layer and the planarizing layer have drain contact holes exposing the drain electrodes of the first and second thin film transistors and a connecting pattern contact hole exposing the first connecting pattern, and the gate insulating layer, the first passivation layer and the planarizing layer have a gate contact hole exposing the plurality of gate patterns, wherein the first and second pixel electrodes are connected to the drain electrodes of the first and second thin film transistors, respectively, through the drain contact holes in the first passivation layer and the planarizing layer, and wherein the second connecting pattern is connected to the plurality of gate patterns through the gate contact hole in the gate insulating layer, the first passivation layer and the planarizing layer and is connected to the first connecting pattern through the connecting pattern contact hole in the first passivation layer and the planarizing layer.

13. A display device, comprising:

a substrate having a plurality of pixel regions;

a plurality of gate lines on the substrate, each of the plurality of gate lines including a plurality of gate patterns spaced apart from each other;

a plurality of data lines crossing the plurality of gate lines to define the plurality of pixel regions;

a first connecting pattern connecting the plurality of gate patterns, the first connecting pattern having a different layer from the plurality of gate patterns; and a liquid crystal layer on the plurality of gate line and the plurality of data lines, the liquid crystal layer including a plurality of liquid crystal capsules, wherein the plurality of pixel regions includes first and second pixel regions vertically adjacent to each other, wherein the plurality of gate lines includes first and second gate lines between the first and second pixel regions, and the first and second gate lines are disposed parallel to each other and are spaced apart from each other, and wherein the first connecting pattern is disposed between the first pixel region and the second gate line to connect the plurality of gate patterns of the first gate line and is disposed between the second pixel region and the first gate line to connect the plurality of gate patterns of the second gate line.

14. The display device of claim 13, further comprising:

first and second thin film transistors corresponding to each of the plurality of pixel regions and connected to the plurality of gate lines and the plurality of data lines;

a planarizing layer on the first and second thin film transistors; and first and second pixel electrodes alternately disposed on the planarizing layer and connected to the first and second thin film transistors, respectively.

* * * * *